(12) United States Patent
Lee et al.

(10) Patent No.: US 12,153,296 B2
(45) Date of Patent: Nov. 26, 2024

(54) VIEWING ANGLE CONTROL FILM AND DISPLAY DEVICE COMPRISING THE SAME

(71) Applicant: LG Display Co., Ltd., Seoul (KR)

(72) Inventors: Sanghyun Lee, Paju-si (KR); Minsoo Park, Paju-si (KR); Chiyong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 7 days.

(21) Appl. No.: 17/977,693

(22) Filed: Oct. 31, 2022

(65) Prior Publication Data

US 2023/0204990 A1 Jun. 29, 2023

(30) Foreign Application Priority Data

Dec. 27, 2021 (KR) .......................... 10-2021-0187966

(51) Int. Cl.
*G02F 1/13* (2006.01)
*G02F 1/1343* (2006.01)

(52) U.S. Cl.
CPC ...... *G02F 1/1323* (2013.01); *G02F 1/134309* (2013.01)

(58) Field of Classification Search
CPC ............ G02F 1/1323; G02F 1/134309; G09G 2320/028; G09G 2320/068
See application file for complete search history.

(56) References Cited

U.S. PATENT DOCUMENTS

| | | | |
|---|---|---|---|
| 2006/0262057 A1* | 11/2006 | Sumiyoshi | G09G 3/3614 345/87 |
| 2008/0272995 A1* | 11/2008 | Sakaguchi | G06F 1/1647 345/87 |
| 2019/0162990 A1* | 5/2019 | Nishimura | G02F 1/167 |

FOREIGN PATENT DOCUMENTS

| | | |
|---|---|---|
| KR | 10-2018-0113552 A | 10/2018 |
| KR | 10-2195645 B1 | 12/2020 |
| KR | 10-2021-0019587 A | 2/2021 |
| KR | 10-2021-0069293 A | 6/2021 |

* cited by examiner

*Primary Examiner* — Roy P Rabindranath
(74) *Attorney, Agent, or Firm* — Birch, Stewart, Kolasch & Birch, LLP

(57) ABSTRACT

A viewing angle control film and a display device comprising the same are discussed. The viewing angle control film can include a first electrode, a second electrode facing away from the first electrode, a light conversion layer disposed between the first electrode and the second electrode, and a controller configured to adjust a viewing angle of the light conversion layer by controlling a voltage applied between the first electrode and the second electrode. The light conversion layer can include a plurality of partition walls disposed to be spaced apart between the first electrode and the second electrode, a plurality of containing portions disposed between the partition walls and arranged at regular intervals along the first electrode, and light blocking particles provided in each of the plurality of containing portions. The controller applies a pulse voltage in a share mode that operates in a wide viewing angle.

18 Claims, 13 Drawing Sheets

VIEWING ANGLE CONTROL FILM AND DISPLAY DEVICE COMPRISING THE SAME

CROSS REFERENCE TO RELATED APPLICATION

The present application claims priority to Korean Patent Application No. 10-2021-0187966, filed on Dec. 27, 2021 in the Republic of Korea, the entire contents of which are incorporated by reference into the present application.

BACKGROUND OF THE DISCLOSURE

Field

The present disclosure relates to a viewing angle control film and a display device such as a liquid crystal display device including the same.

Description of the Related Art

Along with the development of the information society, a demand for display devices for displaying images is more and more increasing in a variety of application fields. For a display device, various display devices such as a liquid crystal display device, a light emitting display device, an organic light emitting display device, a micro light emitting display device, and a quantum dot light emitting display device and so on are recently being utilized.

Such display devices are developed to have a wide viewing angle so that a user is able to see images of the display device from various angular directions. However, there is a case where the wide viewing angle of the display device can adversely affect the characteristics of the product, and thus the display device providing a narrow viewing angle is needed for the case.

For example, for an automatic bank teller machine (ATM), it is more desirable that the ATM has a display with a narrow viewing angle because, when a user inputs his personal information, it is needed to prevent other people next to the user from recognizing the personal information. Also, when the viewing angle of the display is wide for a vehicle navigation system, light can be reflected on the windshield of the vehicle during driving the vehicle at night, which can adversely affect the safety of the driver. In addition, for a computer or a mobile phone, if a user does not want to expose the user's privacy data, the wide viewing angle of the display device may not be desirable for the user's need.

Therefore, studies for a viewing angle control film capable of adjusting a viewing angle to be suitable for a required situation have been actively ongoing.

The viewing angle control film can block light from a specific direction and transmit light from a specific direction by controlling a movement light path, thereby controlling a user's viewing angle.

In such viewing angle control film, a user can turn on/off the viewing angle control, and it is possible to block light in a specific direction or to transmit light in a specific direction by dispersion and agglomeration of light blocking particles according to an electrical signal.

When the viewing angle control film is driven for a long period of time in a share mode in which incident light is emitted beyond a predetermined angle range, an agglomeration phenomenon of the light blocking particles can occur. When the agglomeration phenomenon of the light blocking particles occurs, since the reactivity to electrical signals is reduced, the luminance of light in a side view can be reduced or dark spots can occur in a share mode, and a stain defect can occur when switched to a private mode.

SUMMARY OF THE DISCLOSURE

The present disclosure is to solve or address the above-mentioned and other limitations associated with the related art, and therefore provides a solution to prevent the reduction of luminance in a side view or the dark spot defect even when being driven for a long period of time in the share mode. Furthermore, for example, such solution can prevent occurrence of the stain defect when switched to the private mode.

A viewing angle control film according to an embodiment of the present disclosure includes: a first electrode; a second electrode facing away from the first electrode; a light conversion layer disposed between the first electrode and the second electrode; and a controller configured to adjust a viewing angle of the light conversion layer by controlling a voltage applied between the first electrode and the second electrode, wherein the light conversion layer includes a plurality of partition walls disposed to be spaced apart between the first electrode and the second electrode; and a plurality of containing portions formed between the partition walls and arranged at regular intervals along the first electrode; light blocking particles provided in each of the plurality of containing portions, wherein the controller can apply a pulse voltage in a share mode that operates in a wide viewing angle.

The controller applies a pulse voltage swinging between a second voltage and a voltage of 0 V in the share mode.

The controller applies a pulse voltage swinging between a second voltage having a positive polarity and a third voltage having a negative polarity in the share mode.

A magnitude of the second voltage in absolute value can be greater than a magnitude of the third voltage in absolute value.

The controller applies a first voltage greater than the second voltage for a predetermined period of time when switched from a private mode operating in a narrow viewing angle to the share mode.

The controller alternately supplies a first pulse voltage swinging between a second voltage and a third voltage; and a second pulse voltage swinging between a fourth voltage and a fifth voltage.

The fourth voltage can be greater than the second voltage.

The controller supplies the first pulse voltage during a first period and supplies the second pulse voltage during a second period that is longer than the first period.

The second voltage and the fourth voltage can be positive-polarity voltages, and the third voltage and the fifth voltage can be negative-polarity voltages.

A magnitude of the third voltage in absolute value can be greater than a magnitude of the fifth voltage in absolute value.

A magnitude of the second voltage in absolute value can be greater than a magnitude of the third voltage in absolute value, and a magnitude of the fourth voltage in absolute value can be greater than a magnitude of the fifth voltage in absolute value.

The controller can apply a first voltage greater than the fourth voltage for a predetermined period of time when switched from a private mode operating in a narrow viewing angle to the share mode.

A display device according to an embodiment of the present disclosure includes a display panel including pixels disposed therein and configured to display an image; and a viewing angle control film, wherein the viewing angle control film is disposed on the display panel and is operated in a private mode in which light emitted from the display panel is controlled to be emitted only within a predetermined angle range or in a share mode in which light emitted from the display panel is controlled to be emitted beyond the predetermined angle range.

The viewing angle control film according to an embodiment of the present disclosure and the display device including the same can reduce or prevent reduction of the luminance of light in a side view or occurrence of a dark spot defect even when being driven for a long period of time in a share mode, and at the same time prevent the occurrence of a stain defect when switched to a private mode.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
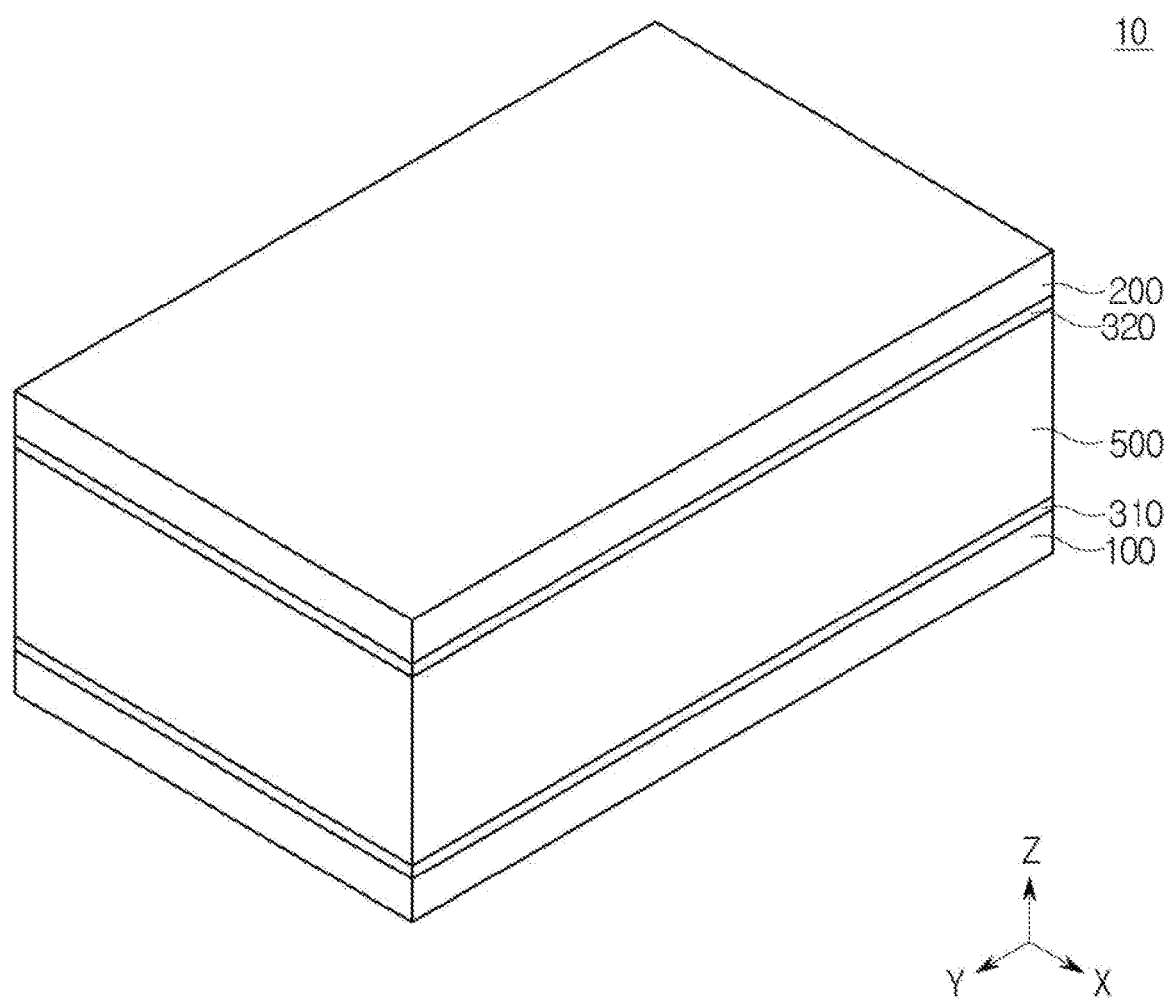
FIG. 1 is a drawing illustrating a perspective view of a viewing angle control film.

The shapes, sizes, ratios, angles, numbers and the like illustrated in the accompanying drawings for describing the various embodiments of the present disclosure are merely examples, and the present disclosure is not limited thereto. The same or like reference numerals generally denote the same or like elements throughout the specification. Further, in the following description of the present disclosure, a detailed explanation of known related technologies can be omitted to avoid unnecessarily obscuring the subject matter of the present disclosure. The terms such as "comprising," "having," "including" and the like used herein are generally intended to allow other elements to be added unless the terms are used with the term "only". Any references to singular can include plural unless expressly stated otherwise.

Elements are interpreted to include an ordinary error range even if not expressly stated.

When the positional relation between two parts is described using the terms such as "on", "above", "below", "next to" and the like, one or more parts can be positioned between the two parts unless the terms are used with the term "immediately" or "directly".

Although the terms "first", "second" and the like are used for describing various elements, these elements are not confined by these terms. These terms are merely used for distinguishing one element from another element, and may not define any order or sequence. Therefore, a first element to be mentioned below can be a second element in a technical concept of the present disclosure.

The same or like reference numerals generally denote the same or like elements throughout the specification.

Hereinafter, various embodiments of the present disclosure will be described in detail with reference to accompanying drawings. Names of elements used in the following description can be selected in consideration of ease of specification preparation, and thus the names of the elements can be different from names of elements used in practical products. Further, all the components of each viewing angle control film and each display device including the same according to all embodiments of the present disclosure are operatively coupled and configured.

Figure 2:
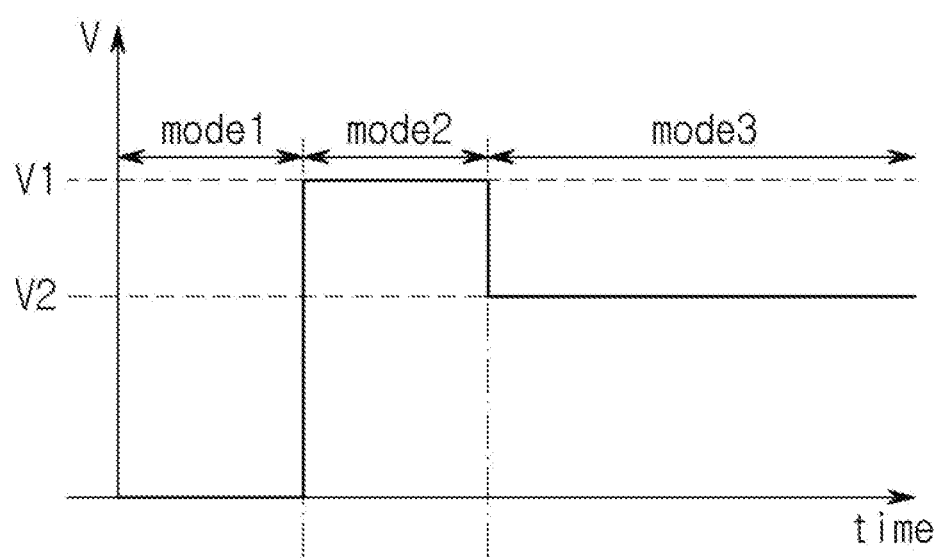
FIG. 2 is a waveform diagram illustrating a driving voltage of the viewing angle control film.
Figure 3:
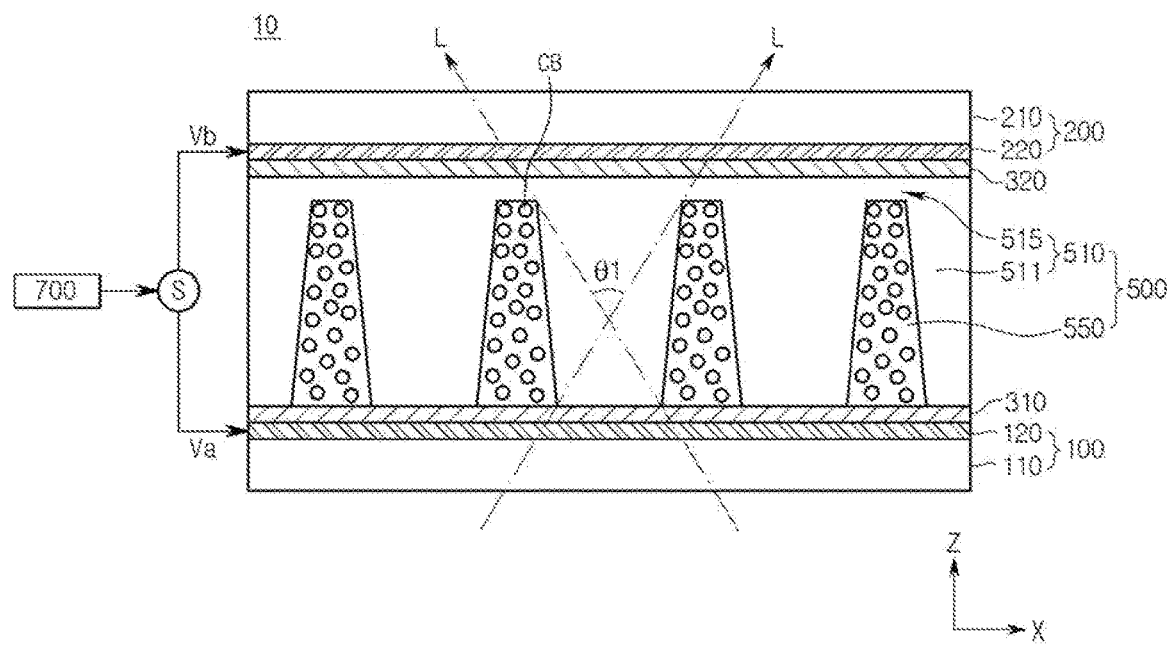
FIG. 3 is a drawing of a portion of FIG. 1 for describing a light path in a private mode.
Figure 4:
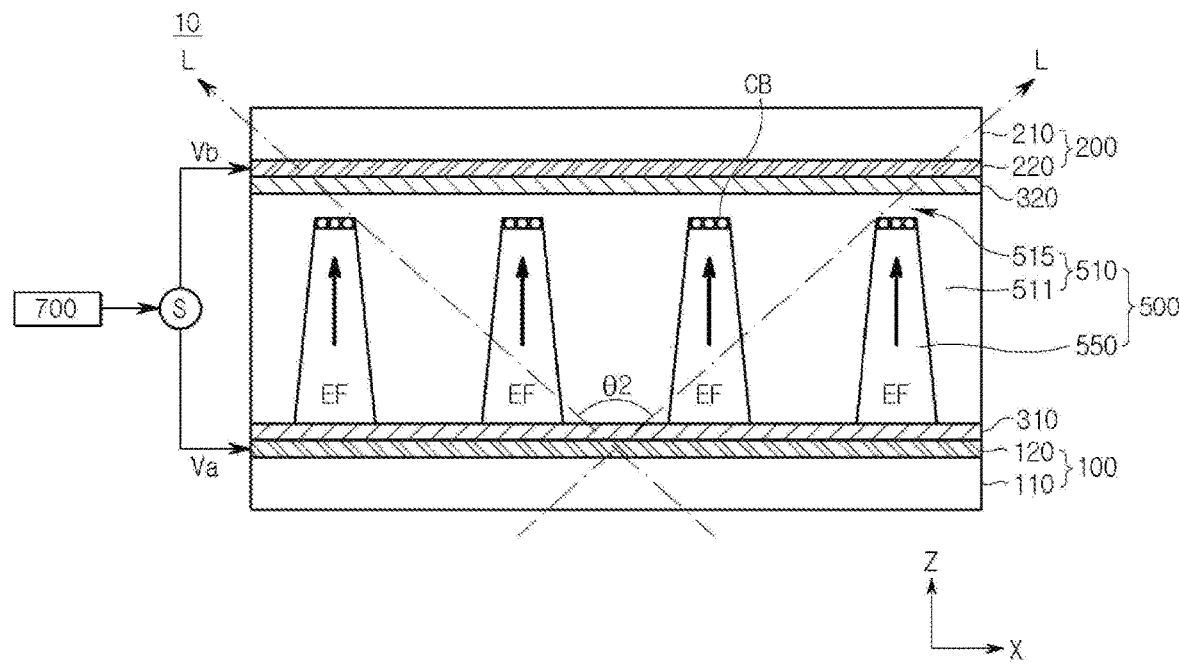
FIG. 4 is a drawing of a portion of FIG. 1 for describing a light path in a share mode.

FIG. 1 is a drawing illustrating a perspective view of a viewing angle control film. FIG. 2 is a waveform diagram illustrating a driving voltage of the viewing angle control film. FIG. 3 is a drawing of a portion of FIG. 1 for describing a light path in a private mode. FIG. 4 is a drawing of a portion of FIG. 1 for describing a light path in a share mode.

Referring to FIGS. 1-3, a viewing angle control film 10 includes a first film 100, a second film 200, a light conversion layer 500, and an adhesive layer 310 and 320.

The viewing angle control film 10 can constitute a display device that controls light emitted from a display panel according to an operation mode by being coupled to the display panel. For example, the viewing angle control film 10 can be coupled to a side of the display panel from which the light is emitted so that light emitted from the display panel is emitted only within a predetermined angle range and light outside the predetermined angle range is blocked, thereby controlling light emitted from the display panel. In addition, the viewing angle control film 10 can allow light emitted from the display panel to be emitted beyond the predetermined angle range.

Hereinafter, emitting light emitted from the display panel only within the predetermined angle range is referred to as a private mode (or narrow viewing angle mode), and emitting light emitted from the display beyond the predetermined angle range is referred to as a share mode (or wide viewing angle mode). The viewing angle control film 10 can be driven as being switched to the private mode or the share mode.

The viewing angle control film 10 includes a first film 100, a first adhesive layer 310 disposed on the first film 100, a light conversion layer 500 disposed on the first adhesive layer 310, a second adhesive layer 320 disposed on the light conversion layer 500, a second film 200 disposed on the second adhesive layer 320, and a controller 700 configured to adjust a magnitude of an electric field applied to the light conversion layer 500.

The first film 100 can be disposed on the lowermost side of the viewing angle control film 10. When the viewing angle control film 10 is coupled to a display panel, the first film 100 can be a portion coupled to the display panel. The first film 100 can be coupled to the display panel through a transparent adhesive or the like.

The first film 100 includes a first base film 110 and a first electrode 120. The first electrode 120 can be disposed on an upper surface of the first base film 110. The first electrode 120 can include a transparent conductive material. For example, the first electrode 120 can include at least one metal of chromium (Cr), nickel (Ni), copper (Cu), aluminum (Al), silver (Ag), molybdenum (Mo), gold (Au), titanium (Ti), and an alloy thereof. The first electrode 120 is for forming an electric field in the viewing angle control film 10. The first electrode 120 is connected to a power supply unit S and thus can contribute to a formation of an electric field according to the voltage supplied by the power supply unit S.

The second film 200 can be disposed to face the first film 100 while being spaced apart from the first film 100 by a predetermined distance. The first and second adhesive layers 310 and 320 and the light conversion layer 500 can be disposed between the first film 100 and the second film 200.

The second film 200 can be disposed on the uppermost side of the viewing angle control film 10. When the viewing angle control film 10 is coupled to the display panel, the second film 200 can be a portion where light emitted from the display panel finally passes through.

The second film 200 can have the same shape and thickness as the first film 100. The second film 200 includes a second base film 210 and a second electrode 220. The second electrode 220 can be disposed on the lower surface of the second base film 210. Like the first electrode 120, the second electrode 220 can include a transparent conductive material. The second electrode 220 can form an electric field together with the first electrode 120 by being connected to the power supply unit S. When an electric field is formed between the first electrode 120 and the second electrode 220 according to the voltage applied by the power supply unit S, the share mode can be implemented as illustrated in FIG. 4. In addition, since an electric field is not formed between the first electrode 120 and the second electrode 220 when the power supply unit S does not apply a voltage, the private mode can be implemented as illustrated in FIG. 3.

The light conversion layer 500 can be disposed between the first film 100 and the second film 200. Specifically, the light conversion layer 500 can be disposed between the first electrode 120 and the second electrode 220. The light conversion layer 500 includes a plurality of containing portions 550 and a louver layer 510 surrounding the plurality of containing portions 550.

The containing portion 550 is partitioned into a plurality of regions by the louver layer 510. The containing portion 550 includes dispersing liquid and light blocking particles CB.

The dispersing liquid can be a material for dispersing the light blocking particles CB. The dispersing liquid can include a transparent material. The dispersing liquid can include a non-polar solvent. The dispersing liquid can include a material capable of transmitting light. For example, the dispersing liquid can include at least one of halocarbon-based oil, paraffin-based oil, and isopropyl alcohol. The light blocking particles CB can be light absorbing particles.

The light blocking particles CB can have a color. The light blocking particles can have a black-based color. For example, the light blocking particles CB can include an opaque material such as a metal material, a metal oxide material, or a nitride material. More specifically, the light blocking particles CB can include any one selected from carbon, silicon nitride (SiN), titanium nitride (TiN), silicon carbide (SiC), tantalum (Ta), titanium (Ti), tungsten (W), copper oxide (CuO), aluminum oxide (Al2O3), iron oxide (Fe3O4), and tantalum oxide (Ta2O5). In addition, the light blocking particles CB can be formed of an organic material having excellent light absorbing property. The light blocking particles CB can be electrically charged at a surface thereof. The light blocking particles CB can move in one direction according to an applied electric field. The light blocking particles CB can be provided as a material including a plurality of carbon particles in oil, and the carbon particles can block light by absorbing light. In this case, the private mode can be implemented.

Hereinafter, it will be described under the assumption that the light blocking particles CB include carbon particles and that the surface thereof is negatively charged. In addition, for convenience of description, the movement and arrangement of the light blocking particles CB will be described based on an electric force EF instead of the term "electric field". Since the light blocking particles CB are negatively charged, the electric force EF that the light blocking particles receive is opposite to the direction of the electric field, which will cause inconvenience to understand the present disclosure. The louver layer 510 includes a plurality of partition walls 511 formed to be spaced apart from each other at regular intervals. In the light conversion layer 500, the partition walls 511 and the containing portions 550 can be alternately disposed along one direction. The partition wall 511 and the containing portions 550 can have the same or different widths with respect to the one direction. In one example, the louver layer 510 can further include a base layer 515 connecting the partition walls 511 to each other. The base layer 515 is a feature according to the imprinting manufacturing method, and is not an essential component to form the viewing angle control film 10.

An adhesive layer can be disposed between the light conversion layer 500 and the first film 100 or between the light conversion layer 500 and the second film 200. For example, the first adhesive layer 310 can be interposed between the light conversion layer 500 and the first electrode 120. In addition, the second adhesive layer 320 can be interposed between the light conversion layer 500 and the second electrode 220.

The adhesive layers 310 and 320 can be an optical clear adhesive OCA or an optical clear resin OCR, but are not limited thereto and can be formed of a different material that can attach the light conversion layer 500 and the first film 100, or the light conversion layer 500 and the second film 200 to each other. The adhesive layers 310 and 320 can be formed of a transparent material.

The power supply unit S is connected to the first electrode and the second electrode and therefore supplies a driving voltage of the viewing angle control film 10. The power supply unit S supplies the first voltage to the first electrode and supplies the second voltage to the second electrode.

The controller 700 can control a voltage applied to the viewing angle control film 10 so that a viewing angle is adjusted based on an operation mode of the viewing angle control film 10. The controller 700 can determine an operation mode of the viewing angle control film 10 as a first mode, a second mode, and a third mode. The controller 700 controls an output voltage of the power supply unit S according to the operation mode of the viewing angle control film 10. The controller 700 can adjust a voltage applied between the first electrode and the second electrode according to an operation mode of the viewing angle control film 10.

Although it is described above that the viewing angle control film 10 includes the controller 700, in some embodiments the viewing angle control film 10 may not include the controller 700, for example, the viewing angle control film 10 can be controlled by a controller connecting to the viewing angle control film 10 externally.

The operation of the viewing angle control film 10 in the private mode will be described with reference to FIGS. 2 and 3, and the operation of the viewing angle control film 10 in the share mode will be described with reference to FIGS. 2 and 4.

The first mode is the private mode, the second mode is a switching-to-share mode where the private mode is switched to the share mode, and the third mode is a maintaining-share mode where a share mode is maintained. The voltage V is a voltage value between the first electrode 120 and the second electrode 220, i.e., V=Vb−Va.

Referring to FIGS. 2 and 3, in the first mode, the power supply unit S supplies the same voltages to the first electrode 120 and the second electrode 220. For example, the potential difference V between the first electrode 120 and the second electrode 220 is 0 V. Accordingly, an electric field is not formed between the first electrode 120 and the second electrode 220, and the light blocking particles CB in the containing portions 550 remain in a dispersed state. Since the light blocking particles CB in the containing portions 550 absorb light, the containing portions 550 block the light. In the private mode, the viewing angle control film 10 provides a narrow viewing angle of θ1.

Referring to FIGS. 2 and 4, in the second and third modes, the power supply unit S supplies different voltages to the first electrode 120 and the second electrode 220. The potential difference V between the first electrode 120 and the second electrode 220 is V1 or V2. Accordingly, the electric force EF acts between the first electrode 120 and the second electrode 220, and the light blocking particles CB in the containing portions 550 are agglomerated in an upper side in a Z-axis direction. In the share mode, since the light blocking particles CB that absorb light are agglomerated in the upper side, the viewing angle control film 10 allows passing most of the inclined light L. Accordingly, in the share mode, the viewing angle control film 10 provides a wide viewing angle of θ2.

The controller 700 can drive the viewing angle control film 10 with a stronger voltage in the second mode than in the third mode to quickly switch from the private mode to the share mode. Accordingly, the voltage V1 in the second mode can be greater than the voltage V2 in the third mode.

Figure 5:
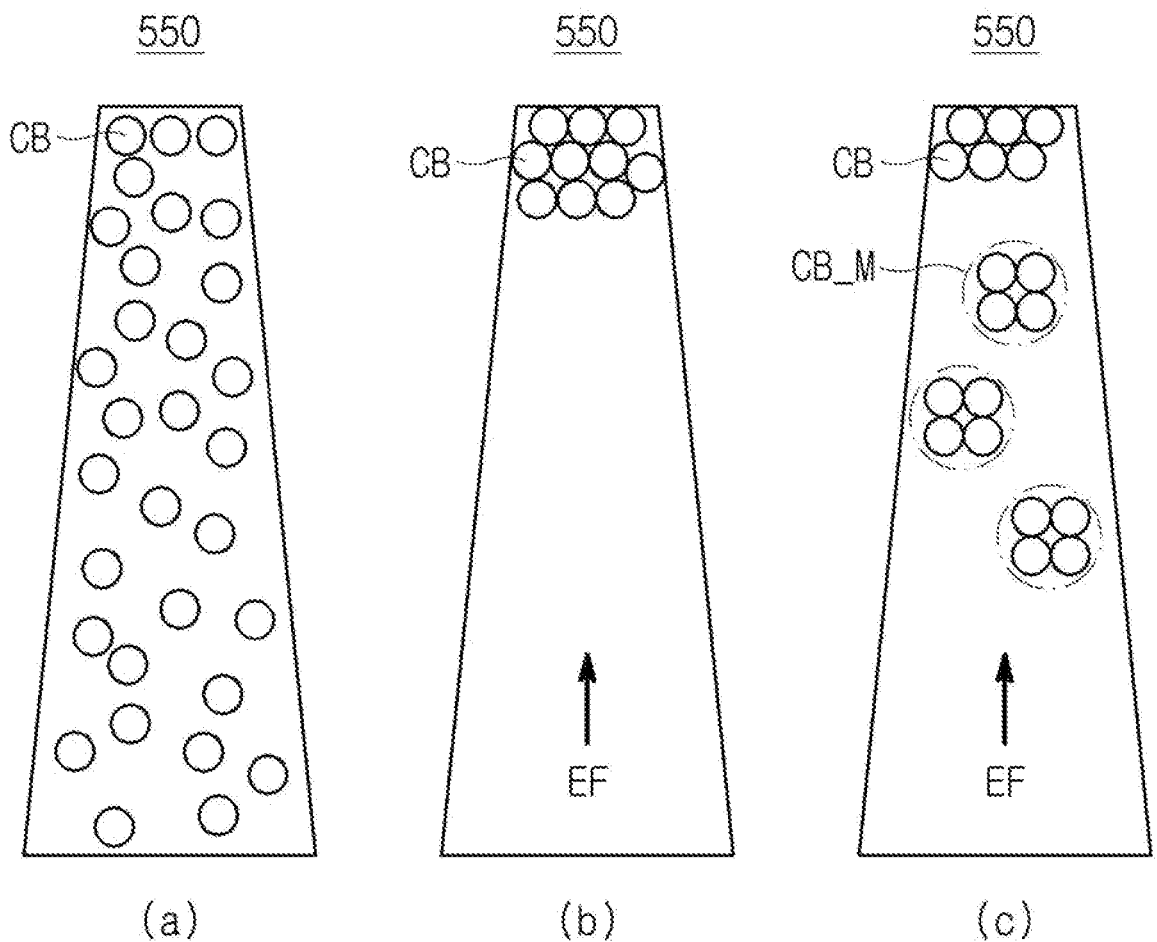
FIG. 5 is a drawing illustrating a state of light blocking particles within a containing portion.

FIG. 5 is a drawing illustrating a state of the light blocking particles CB within the containing portion 550.

Referring to FIG. 5, the part (a) illustrates a state of the light blocking particles CB in the first mode, the part (b) illustrates a state of the light blocking particles CB in the third mode, and the part (c) illustrates a state in which an agglomeration phenomenon of the light blocking particles CB occurs when being driven for a long period of time in the third mode.

In the first mode of (a), no electric force EF is applied within the containing portion 550. Since the light blocking particles CB are mixed with the dispersing liquid, they remain in a dispersed state.

In the third mode of (b), the electric force EF is applied within the containing portion 550. The electric force EF is applied by the potential difference V applied between the first electrode 120 and the second electrode 220. The light blocking particles CB are agglomerated toward the upper side of the containing portion 550 under an influence of the electric force EF.

As shown in part (c), when the third mode is driven for a long period of time, parts of the light blocking particles CB agglomerated in the upper side of the containing portions 550 can be clumped with each other. A light blocking particle mass CB_M formed by agglomerated light blocking particles CB has a reduced reactivity with respect to the electric force EF applied to the containing portion 550. For example, even if the electric force EF is continuously applied within the containing portion 550 in the third mode, the light blocking particle mass CB_M will not be affected by the electric force EF due to increases in size and mass thereof. As a result, in the third mode, the light blocking particle mass CB_M floats in a dispersed state within the containing portion 550 and blocks oblique light. This appears as luminance reduction or dark spots at the side viewing angle of the viewing angle control film 10.

The present disclosure is to solve the limitation of luminance reduction at the side viewing angle due to the agglomeration phenomenon of light blocking particles CB when being driven for a long period of time in the share mode.

Figure 6:
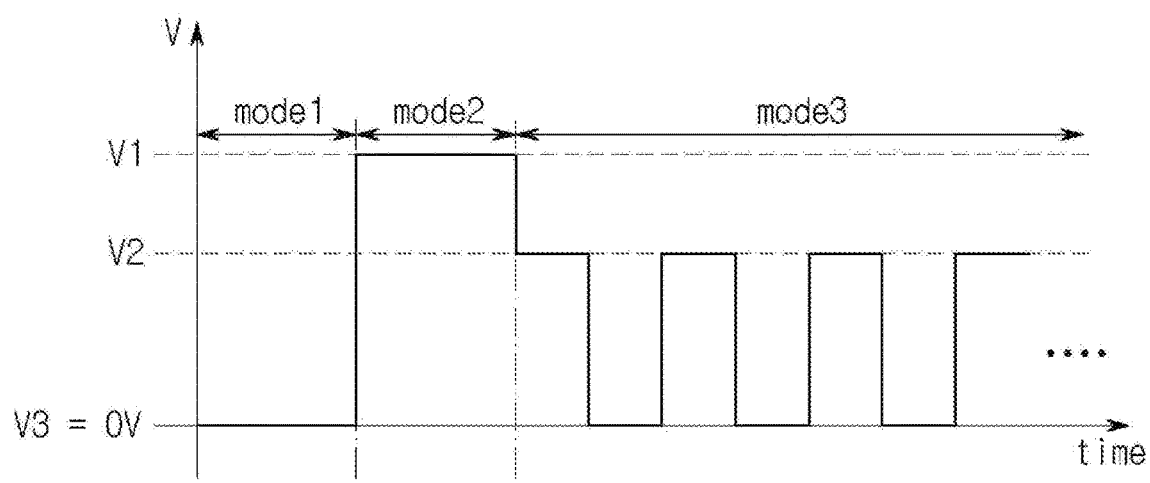
FIG. 6 is a waveform diagram illustrating a driving voltage of a viewing angle control film according to a first embodiment of the present disclosure.
Figure 7:
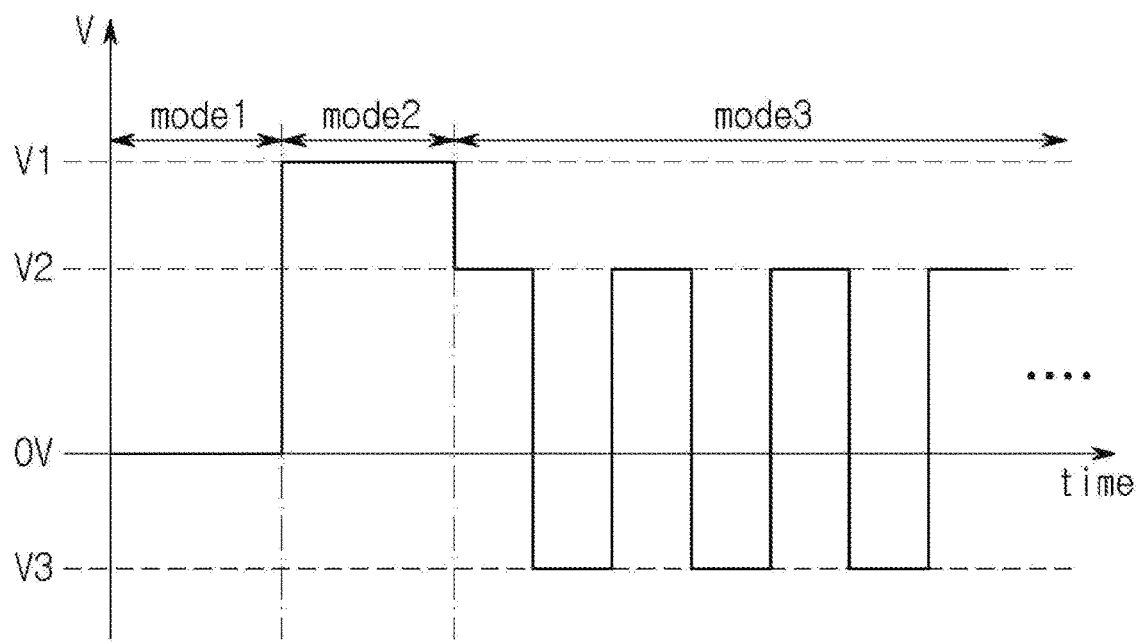
FIG. 7 is a waveform diagram illustrating a driving voltage of a viewing angle control film according to a second embodiment of the present disclosure.

FIG. 6 is a waveform diagram illustrating a driving voltage of a viewing angle control film 10 according to a first embodiment of the present disclosure. FIG. 7 is a waveform diagram illustrating a driving voltage of a viewing angle control film 10 according to a second embodiment of the present disclosure.

The driving voltage of the viewing angle control film 10 according to an embodiment of the present disclosure can apply a pulse voltage in the third mode as illustrated in FIG. 6. Although the driving voltage is illustrated in the drawings including FIG. 6 as a pulse voltage of a square wave, this is exemplary. The driving voltage of the present disclosure does not necessarily have to be a square wave, but can be configured in various waveforms such as a triangular wave and a sine wave.

The inventors of the present disclosure found a limitation in that when a DC voltage is applied in the third mode as illustrated in FIG. 2, the light blocking particles CB are subject to a continuous force in one direction from the upper side (or lower side) within the containing portion 550, and the agglomeration phenomenon of the light blocking particles CB occurs since they are agglomerated together when exposed thereto for a long period of time.

In the present disclosure, a pulse voltage can be applied in the third mode as a means for preventing the agglomeration phenomenon of the light blocking particles CB.

Specifically, the pulse voltage can swing between a second voltage V2 and a third voltage V3. The second voltage V2 can be a positive- or negative-polarity voltage depending on a polarity of the first voltage. The polarities of the first voltage V1 and the second voltage V2 can differ depending on the polarity of the light blocking particles CB and depending on whether, in the second mode and the third mode, the light blocking particles CB are arranged in the upper side or on the lower side. However, it is preferable to set the second voltage V2 to have the same polarity of the first voltage V1.

In FIG. 6, the second voltage V2 has a positive voltage, and the third voltage V3 has a voltage of 0 V. In the third mode, an electric force EF directed to the upper side is applied within the containing portion in the section where the second voltage V2 is applied. In the third mode, an electric force EF is not applied within the containing portion 550 in the section where the third voltage V3 is applied. The light blocking particles CB within the containing portion 550 do not continuously receive a force in the upper-side direction, and instead receive a force that is dispersed by the dispersing liquid without receiving a force in the upper-side direction in the section where the third voltage V3 is applied. For example, in the third mode, the light blocking particles CB do not continuously receive a force in the upper-side direction, and instead has an idle period for releasing the agglomeration of the light blocking particles CB while the third voltage V3 is applied. Therefore, unlike the conventional method of applying a DC voltage, it is possible to prevent the agglomeration phenomenon of the light blocking particles CB in the third mode. The second voltage V2 can be referred to as a holding voltage in terms that it maintains the arrangement of the light blocking particles CB to be in the upper side within the containing portion 550. The third voltage can be referred to as an idle voltage in terms that it releases the agglomeration of the light blocking particles CB.

The embodiment of FIG. 7 has a difference from FIG. 6 in that the third voltage V3 has a negative-polarity voltage. When the third voltage V3 having a negative polarity is applied, an electric force EF in the lower-side direction is applied within the containing portion 550, and the light blocking particles CB agglomerated in the upper side receive a force in the lower-side direction. Therefore, in the section where the third voltage V3 is applied, there is an idle period for releasing the agglomeration of the light blocking particles CB agglomerated in the upper side of the containing portion 550. In the case of FIG. 7 when compared with FIG. 6, since the light blocking particles CB receive a force in the lower-side direction during the idle period, the agglomeration phenomenon of the light blocking particles CB can be more effectively prevented.

It is preferable that a magnitude of the second voltage V2 in absolute value is greater than a magnitude of the third voltage V3 in absolute value. It is because when the magnitude of the third voltage V3 in absolute value is greater than that of the second voltage V2, the agglomeration of the light blocking particles CB is excessively released, and the degree of agglomeration of the light blocking particles CB in the upper side of the containing portion 550 is lowered. When the degree of agglomeration of the light blocking particles CB in the upper side of the containing portion 550 is too low, there occurs a limitation in that the luminance of the side viewing angle is lowered in the third mode.

Figure 8:
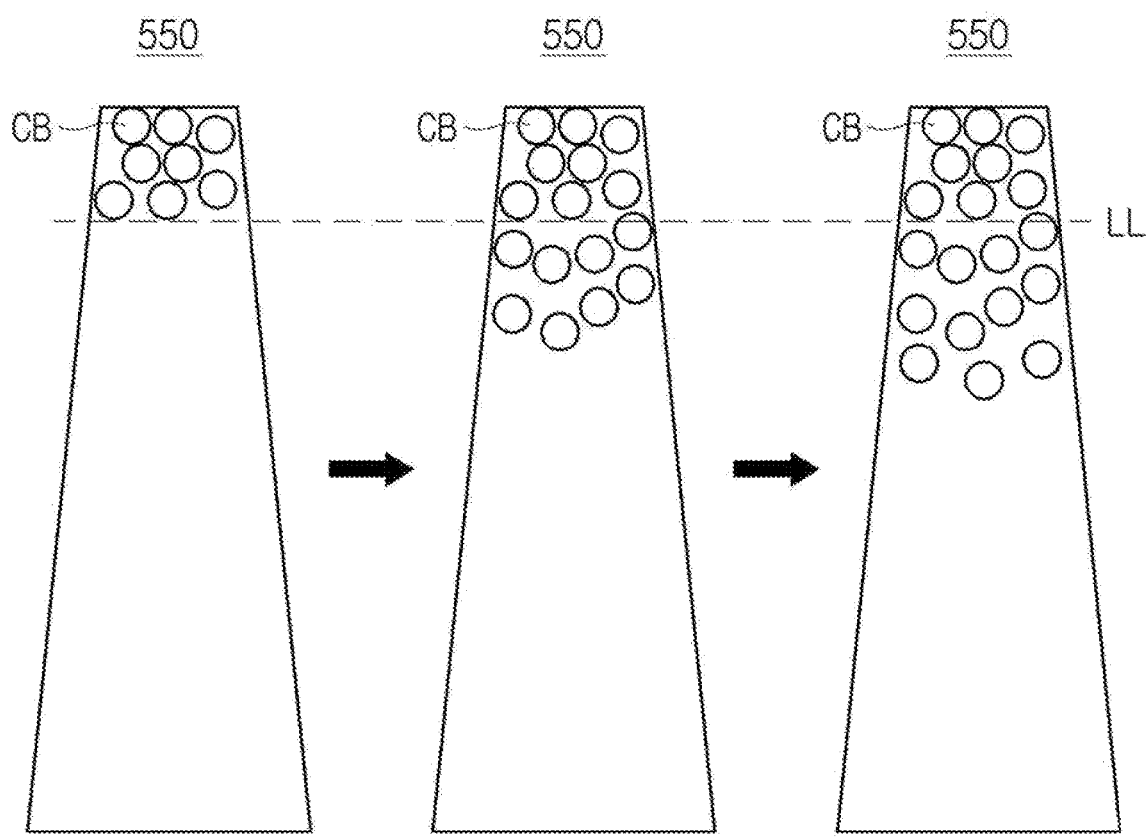
FIG. 8 is a drawing illustrating a state in which light blocking particles are dispersed within a containing portion in a third mode.
Figure 9:
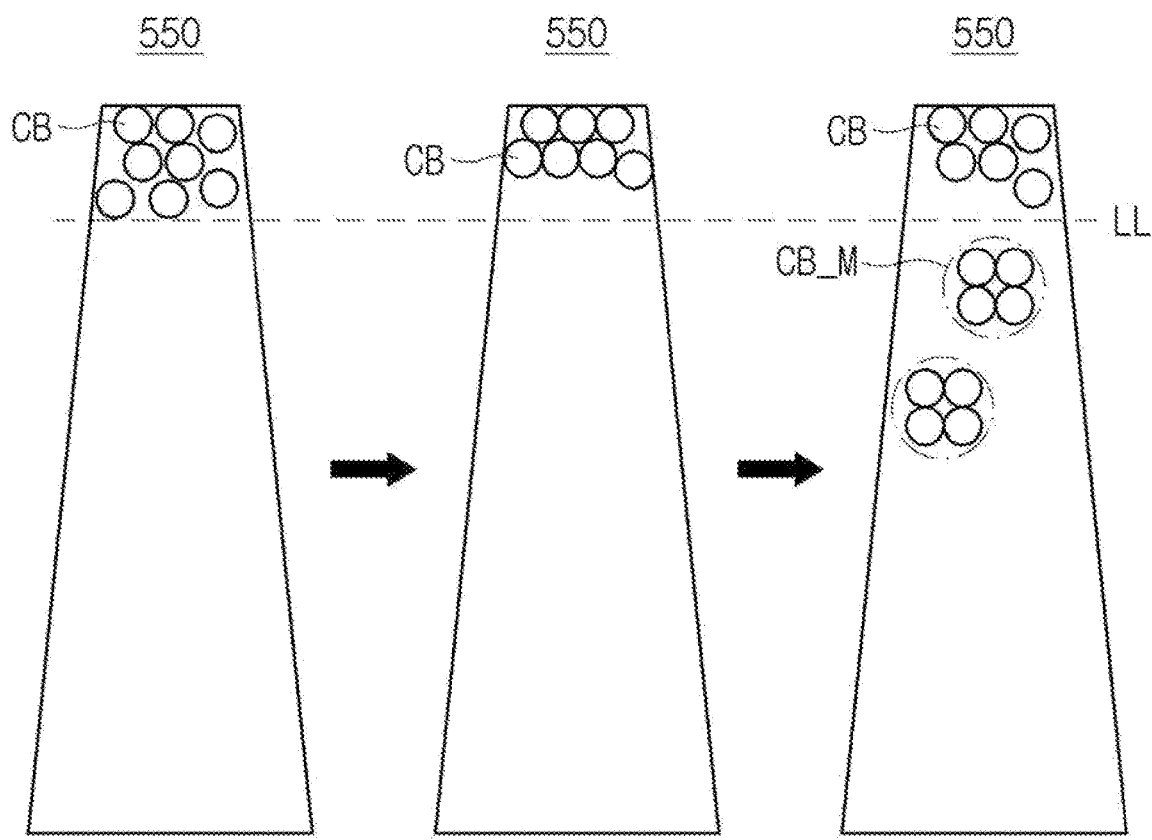
FIG. 9 is a drawing illustrating a state in which light blocking particles are clumped within a containing portion in the third mode.

FIG. 8 is a drawing illustrating a state in which the light blocking particles CB are dispersed within the containing portion 550 in the third mode. FIG. 9 is a drawing illustrating a state in which light blocking particles CB are clumped within the containing portion 550 in the third mode.

Here, LL of FIGS. 8 and 9 indicates a lower limit level to satisfy the minimum luminance specification required for the side viewing angle in the share mode. In the share mode, as the light blocking particles CB within the containing portion 550 are more widely dispersed out of the range of LL, the luminance at the side viewing angle in the share mode becomes lower.

The inventors of the present disclosure additionally found a limitation in that the same phenomenon as in FIG. 8 or FIG. 9 appears when applying a pulse voltage swinging between the second voltage V2 having a positive polarity and the third voltage V3 having a negative polarity in the third mode as in the embodiment of FIG. 7.

FIG. 8 shows a limitation in a case where the second voltage V2, which is a holding voltage, is low. When the second voltage V2 is low, the light blocking particles CB within the containing portion 550 can be gradually dispersed as illustrated in FIG. 8. In the share mode, since the light blocking particles CB within the containing portion 550 are more widely distributed out of the range of LL, the minimum luminance specification required for the side viewing angle is not satisfied.

In contrast to FIG. 8, FIG. 9 shows a limitation in a case where the second voltage V2 is excessively large. When the second voltage V2 is excessively large, the light blocking particles CB in the containing portion 550 receive an excessive force in the upper-side direction. In the share mode, the light blocking particles CB within the containing portion 550 are subject to an excessive agglomeration stress in the upper-side direction, and thus are agglomerated more in the side upper than LL. Even when the third voltage V3 is applied during the idle period, the light blocking particles CB averagely receive a continuous force in the upper-side direction due to the excessive magnitude of the second voltage V2. As a result, a limitation of the agglomeration phenomenon of the light blocking particles CB can occur similarly to the driving method of FIG. 2.

As seen in FIGS. 8 and 9, when being driven for a long period of time in the third mode, the second voltage V2 should not be too small in order to satisfy the condition for achieving the minimum luminance specification required for the side viewing angle (the first condition), and the second voltage V2 should not be too large in order to satisfy the condition for preventing the agglomeration phenomenon of the blocking particles CB (the second condition).

The inventors of the present disclosure have recognized that it can be difficult to set a value of the second voltage V2 that simultaneously satisfies the first condition and the second condition because various variables should be considered. Various variables, can be, for example, the size of the light blocking particles CB provided in the containing portion 550, the degree to which the dispersing liquid disperses the light blocking particles CB, the size of the containing portion 550, the dielectric permittivity of the partition wall, etc.

The inventors of the present disclosure found that the same effect can be achieved by alternately driving a holding voltage that satisfies the first condition and a pulse voltage of the holding voltage that satisfies the second condition instead of applying a holding voltage that simultaneously satisfies the first condition and the second condition. Hereinafter, it will be described in detail with reference to FIGS. 10 to 12.

Figure 10:
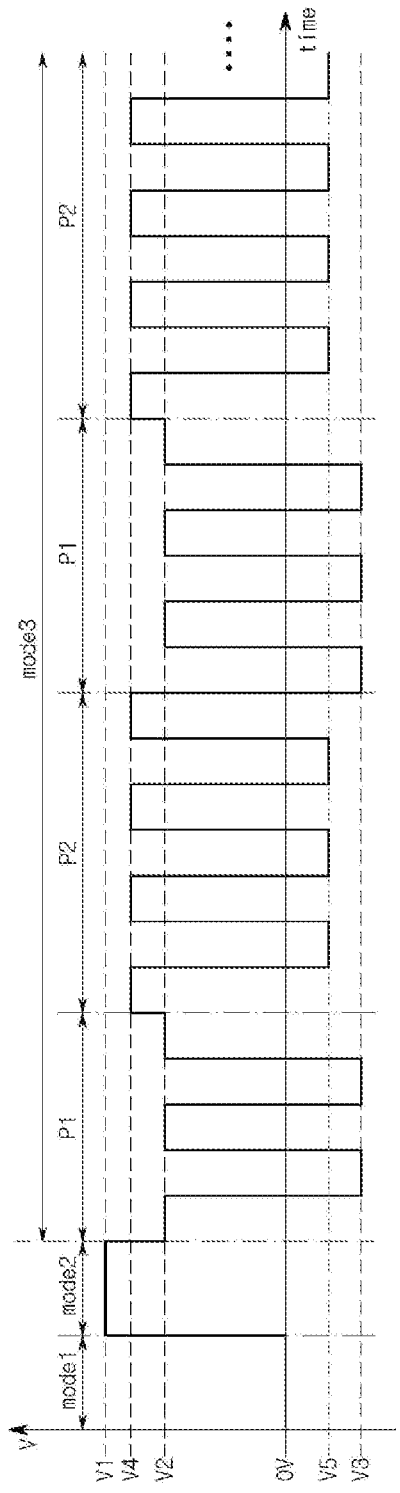
FIG. 10 is a waveform diagram illustrating a driving voltage of a viewing angle control film according to a third embodiment of the present disclosure.

FIG. 10 is a waveform diagram illustrating a driving voltage of a viewing angle control film 10 according to a third embodiment of the present disclosure.

Referring to FIG. 10, a controller 700 alternately supplies a first pulse voltage and a second pulse voltage. The second voltage V2 is a holding voltage that satisfies the above-described second condition, and the fourth voltage V4 is a holding voltage that satisfies the first condition. The first pulse voltage is a pulse voltage swinging between the second voltage V2 and the third voltage V3 using the second voltage V2 as the holding voltage. The second pulse voltage is a pulse voltage swinging between the fourth voltage V4 and the fifth voltage V5 using the fourth voltage V4 as the holding voltage. The first pulse voltage is applied during a first period P1, and the second pulse voltage is applied during a second period P2. The first pulse voltage and the second pulse voltage are alternately applied.

It is preferable that the second period P2 is longer than the first period P1. In addition, it is preferable that a magnitude of the fourth voltage V4 is greater than a magnitude of the second voltage V2. When the second period P2 is shorter than the first period P1, the agglomeration stress applied to the light blocking particles CB is too low, so that the luminance of the side viewing angle can be gradually lowered when being driven for a long period of time. Even when the magnitude of the fourth voltage V4 is smaller than the magnitude of the second voltage V2, the agglomeration stress applied to the light blocking particles CB is too low, and thus the luminance of the same side viewing angle can be decreased.

Figure 11:
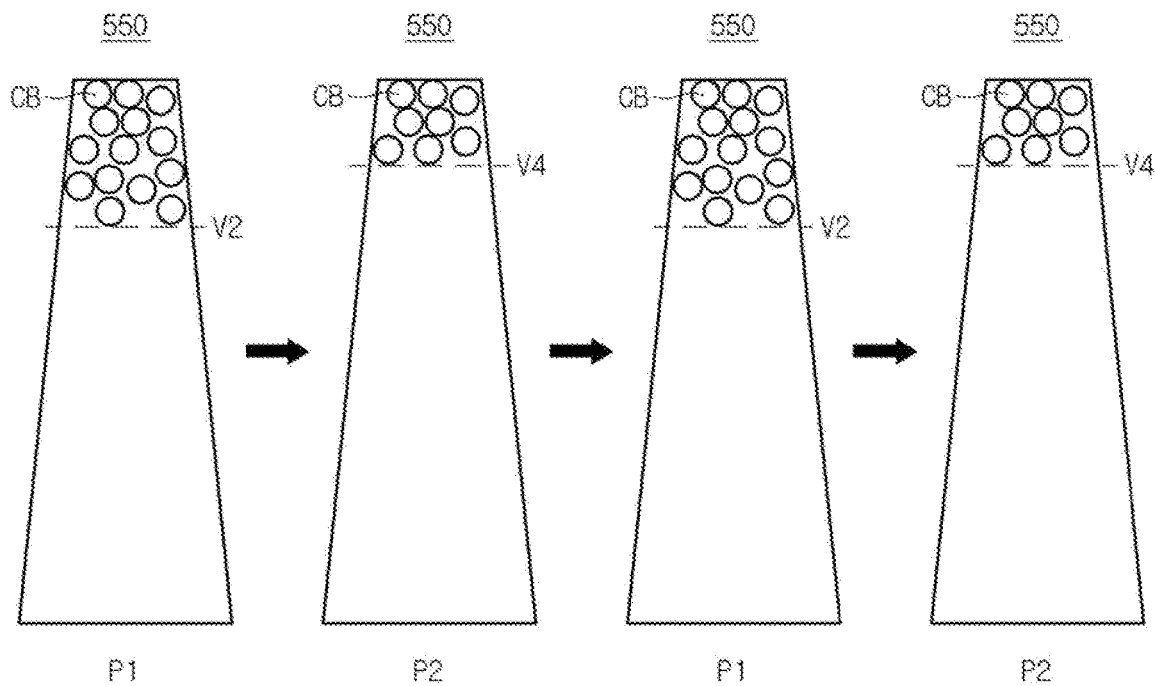
FIG. 11 is a drawing illustrating a state of light blocking particles within a containing portion according to the third embodiment of the present disclosure.

FIG. 11 is a drawing illustrating a state of the light blocking particles CB within the containing portion 550 according to the third embodiment of the present disclosure.

Referring to FIG. 11, the degree of agglomeration of the light blocking particles CB in the upper side of the containing portion 550 is determined according to the magnitude of the holding voltage. In the first period P1, the light blocking particles CB are relatively widely distributed to the line V2 according to the second voltage V2 that is the holding voltage. In the second period P2, the light blocking particles CB are distributed as being relatively agglomerated to the line V4 according to the fourth voltage V4 that is the holding voltage. In the first period P1, the distance between the light blocking particles CB is relatively increased, and the distance between the light blocking particles CB is relatively decreased in the second period P2. In other words, the agglomeration stress of the light blocking particles CB is relieved in the first period P1, and the agglomeration stress of the light blocking particles CB is increased in the second period P2.

Figure 12:
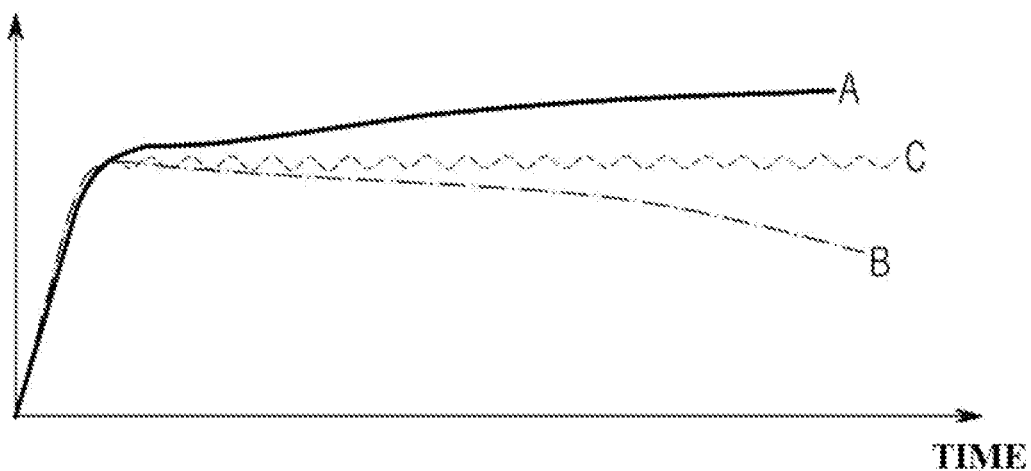
FIG. 12 is a graph comparing luminance changes of a side viewing angle according to the first, second and third embodiments of the present disclosure.

FIG. 12 is a graph comparing the luminance changes of the side viewing angle in the third mode as per the respective magnitudes of the holding voltage.

Referring to FIG. 12, first, graphs A and B indicate the cases of applying a pulse voltage in that the holding voltage has one level, and graph C indicates the case of applying a pulse voltage in that the holding voltage has two levels.

Graph A indicates the case where the holding voltage is excessively large. Graph A shows that the light blocking particles CB within containing portion 550 are excessively agglomerated in the upper-side direction, so that the side luminance increases with time. When this state continues for a long period of time, the limitation of agglomeration phenomenon of the light blocking particles CB occurs as described with reference to FIGS. 8 and 9.

Graph B indicates the case where the holding voltage is too small. Graph B shows that the light blocking particles CB within the containing portion 550 are gradually dispersed in the lower-side direction, and thus the side luminance decreases with time.

Graph C shows that the side luminance is maintained within a certain range with repeatedly increasing and decreasing, which means that the light blocking particles CB within the containing portion 550 maintain appropriate distances.

Therefore, according to the third embodiment of the present disclosure, the limitation of agglomeration phenomenon of the light blocking particles CB by the light blocking particles CB being gradually clumped can be prevented, and at the same time, the limitation of reduction of the side luminance by the light blocking particles CB being dispersed gradually can be solved.

Figure 13:
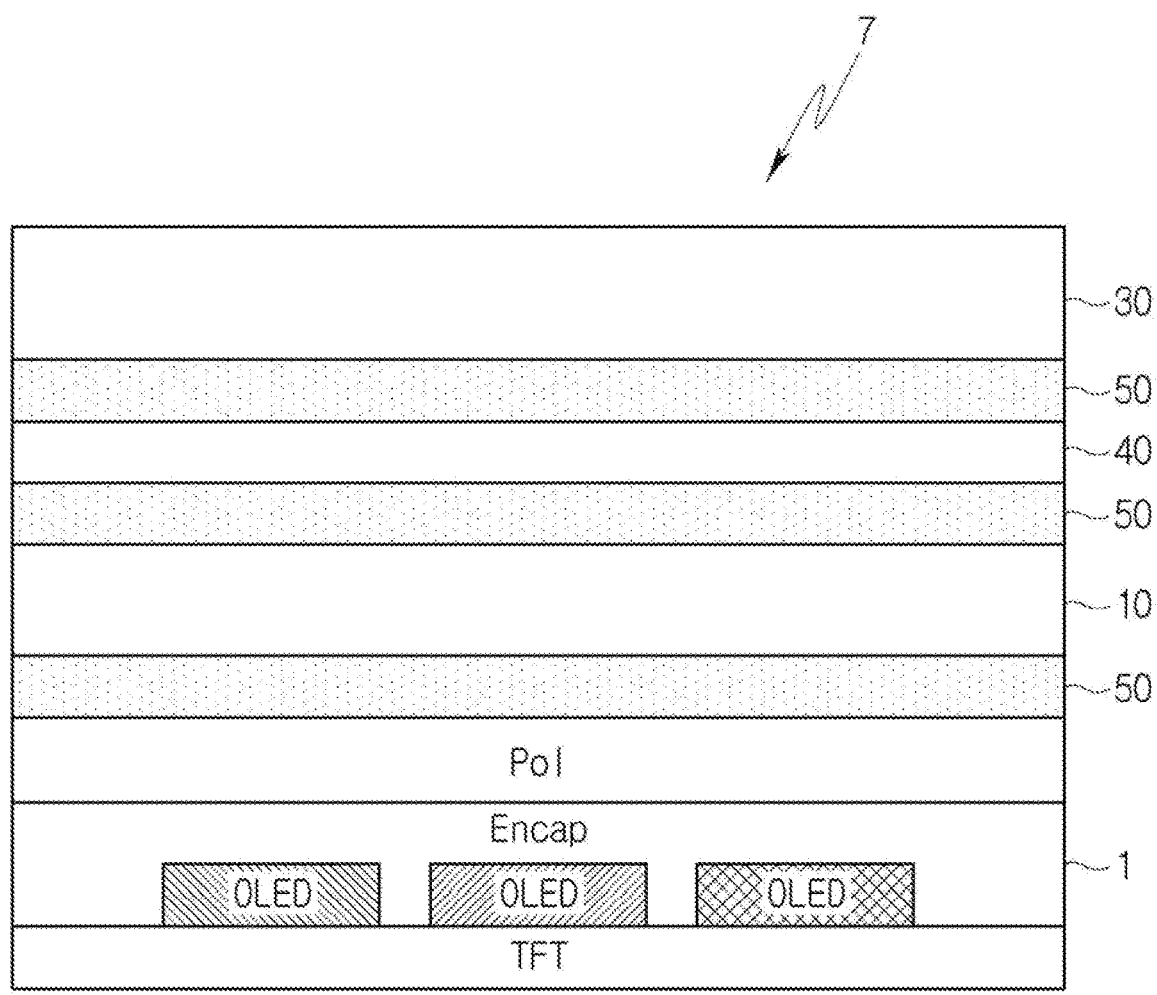
FIG. 13 is a cross-sectional view of a display device according to an embodiment of the present disclosure.

FIG. 13 is a cross-sectional view of a display device according to an embodiment of the present disclosure.

Referring to FIG. 13, a display device 7 can include a display panel 1, a viewing angle control film 10, and a cover substrate 30.

The display panel 1 can include a plurality of pixels disposed in a display area of a base substrate and driving units disposed in a non-display area around the display area for driving the pixels. The pixels can include transistors TFT connected to the driving units through a control signal line and light emitting diodes OLED connected to the transistors. The transistors are turned on or off according to a control signal applied through the control signal line, and therefore adjust the amount of current applied to the light emitting diodes. The light emitting diode can emit light with a luminance corresponding to the amount of current applied through the transistor. The display panel 1 can further include a protective layer Encap encapsulating the light emitting diodes OLED and an upper protective substrate Pol.

The viewing angle control film 10 can be disposed on the display panel 1. The viewing angle control film 10 can control a light path generated in the display panel 1 according to an operation mode of the display device 7. For example, when the display device 7 operates in the private mode, which is the first mode, the light conversion layer 500 of the viewing angle control film 10 is controlled to be the light blocking mode, and therefore can open a view with respect to the front of the display device 7, and can block a view with respect to the side. In the private mode, the viewing angle control film 10 can be disposed on the display panel and can control light emitted from the display panel to be emitted only within the predetermined angle range. When the display device 7 operates in the share mode, which is the second mode, the light conversion layer 500 of the viewing angle control film 10 is controlled to be the light-transmitting mode and therefore can open a view with respect to the front and side of the display device 7. In the share mode, the viewing angle control film 10 can control light emitted from the display panel to be emitted beyond the predetermined angle range.

The cover substrate 30 can be disposed on the viewing angle control film 10. The cover substrate 30 can be provided to protect the display device 7 from external impacts or foreign substances. The cover substrate 30 can be a light-transmitting substrate, and can be a rigid substrate including glass or tempered glass or a flexible substrate made of a plastic material.

In an embodiment, the display device 7 can further include a touch panel 40. The touch panel 40 can be configured as a capacitive type or a resistive film type, and therefore can sense a user's touch input.

The display panel 1, the viewing angle control film 10, the touch panel 40, and the cover substrate 30 can be attached to each other through the adhesive layers 50. The adhesive layer 50 can be an optical clear adhesive (OCA) or an optical clear resin (OCR).

It will be understood by those skilled in the art that the present disclosure can be embodied in other specific forms without changing the technical idea or essential characteristics of the present disclosure. Therefore, it should be understood that the aspects described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

What is claimed is:

1. A viewing angle control film comprising:
a first electrode;
a second electrode facing away from the first electrode;
a light conversion layer disposed between the first electrode and the second electrode; and
a controller configured to adjust a viewing angle of the light conversion layer by controlling a voltage applied between the first electrode and the second electrode,
wherein the light conversion layer includes:
a plurality of partition walls disposed to be spaced apart between the first electrode and the second electrode;
a plurality of containing portions disposed between the plurality of partition walls and arranged at regular intervals along the first electrode; and
light blocking particles provided in each of the plurality of containing portions,
wherein the controller applies a pulse voltage in a share mode that operates in a wide viewing angle,
wherein the pulse voltage is applied between the first electrode and the second electrode of the viewing angle control film, and swings between two voltage levels, and
wherein an electric force is alternately applied and not applied between the first electrode and the second electrode in the plurality of containing portions during the share mode.

2. The viewing angle control film of claim 1, wherein the controller swings the pulse voltage between a second voltage and a voltage of 0 V in the share mode.

3. The viewing angle control film of claim 2, wherein the controller applies a first voltage greater than the second voltage for a predetermined period of time when switched from a private mode operating in a narrow viewing angle to the share mode.

4. The viewing angle control film of claim 1, wherein the controller swings the pulse voltage between a second voltage having a positive polarity and a third voltage having a negative polarity in the share mode.

5. The viewing angle control film of claim 4, wherein a magnitude of the second voltage in absolute value is greater than a magnitude of the third voltage in absolute value.

6. The viewing angle control film of claim 1, wherein the controller, using the pulse voltage, alternately supplies a first pulse voltage swinging between a second voltage and a third voltage, and a second pulse voltage swinging between a fourth voltage and a fifth voltage, in the share mode, and
wherein the fourth voltage is greater than the second voltage.

7. The viewing angle control film of claim 6, wherein the controller supplies the first pulse voltage during a first period and the second pulse voltage during a second period that is longer than the first period.

8. The viewing angle control film of claim 6, wherein the second voltage and the fourth voltage are positive-polarity voltages, and the third voltage and the fifth voltage are negative-polarity voltages.

9. The viewing angle control film of claim 8, wherein a magnitude of the third voltage in absolute value is greater than a magnitude of the fifth voltage in absolute value.

10. The viewing angle control film of claim 8, wherein a magnitude of the second voltage in absolute value is greater than a magnitude of the third voltage in absolute value, and
wherein a magnitude of the fourth voltage in absolute value is greater than a magnitude of the fifth voltage in absolute value.

11. The viewing angle control film of claim 6, wherein the controller applies a first voltage greater than the fourth voltage for a predetermined period of time when switched from a private mode operating in a narrow viewing angle to the share mode.

12. A display device comprising:
a display panel including pixels disposed therein and configured to display an image; and
the viewing angle control film of claim 1,
wherein the viewing angle control film is disposed on the display panel and is operated in a private mode in which light emitted from the display panel is controlled to be emitted only within a predetermined angle range or in the share mode in which light emitted from the display panel is controlled to be emitted beyond the predetermined angle range.

13. The viewing angle control film of claim 1, wherein an operation of the viewing angle control film includes a private mode operating in a narrow viewing angle, the share mode operating in the wide viewing angle, and a switch mode between the private mode and the share mode, and
wherein the controller applies a voltage greater than the pulse voltage in the switch mode.

14. A viewing angle control film comprising:
a first electrode;
a second electrode facing the first electrode; and
a light conversion layer disposed between the first electrode and the second electrode;
wherein the light conversion layer includes a containing portion and a louver layer, the containing portion being partitioned into a plurality of regions by the louver layer and including a dispersing liquid and light blocking particles,
wherein a viewing angle of the light conversion layer is adjusted by adjusting a voltage applied between the first electrode and the second electrode,
wherein a pulse voltage is applied between the first electrode and the second electrode in a share mode that operates in a wide viewing angle,
wherein the pulse voltage is applied to the first electrode and the second electrode of the viewing angle control film, and swings between two voltage levels, and
wherein an electric force is alternately applied and not applied between the first electrode and the second electrode in the containing portion during the share mode.

15. The viewing angle control film of claim 14,
wherein a first pulse voltage swinging between a second voltage and a third voltage and a second pulse voltage swinging between a fourth voltage and a fifth voltage are applied alternatively between the first electrode and the second electrode, in the share mode, and
wherein the fourth voltage is greater than the second voltage.

16. A display device comprising:
a display panel including pixels disposed therein and configured to display an image; and
the viewing angle control film of claim 14, wherein the viewing angle control film is disposed on the display panel and is operated in a private mode in which light emitted from the display panel is controlled to be emitted only within a predetermined angle range or in the share mode in which light emitted from the display panel is controlled to be emitted beyond the predetermined angle range.

17. The viewing angle control film of claim 14, wherein an operation of the viewing angle control film includes a private mode operating in a narrow viewing angle, the share mode operating in the wide viewing angle, and a switch mode between the private mode and the share mode, and wherein a voltage greater than the pulse voltage is applied to at least one of the first electrode and the second electrode in the switch mode.

18. A viewing angle control film comprising:
a first electrode;
a second electrode facing the first electrode; and
a light conversion layer disposed between the first electrode and the second electrode;

wherein the light conversion layer includes a containing portion and a louver layer, the containing portion being partitioned into a plurality of regions by the louver layer and including a dispersing liquid and light blocking particles, wherein a viewing angle of the light conversion layer is adjusted by adjusting a voltage applied between the first electrode and the second electrode, wherein a pulse voltage is applied between the first electrode and the second electrode in a share mode that operates in a wide viewing angle, wherein a first pulse voltage swinging between a second voltage and a third voltage and a second pulse voltage swinging between a fourth voltage and a fifth voltage are applied alternatively between the first electrode and the second electrode, in the share mode, and wherein the fourth voltage is greater than the second voltage.

* * * * *